US009793004B2

(12) United States Patent
Zhang

(10) Patent No.: US 9,793,004 B2
(45) Date of Patent: Oct. 17, 2017

(54) SHIFT REGISTER, GATE DRIVER, AND DISPLAY APPARATUS

(71) Applicant: BOE TECHNOLOGY GROUP CO., LTD., Beijing (CN)

(72) Inventor: Yuting Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 630 days.

(21) Appl. No.: 13/996,094

(22) PCT Filed: Feb. 18, 2013

(86) PCT No.: PCT/CN2013/071643
§ 371 (c)(1),
(2) Date: Jun. 20, 2013

(87) PCT Pub. No.: WO2013/131425
PCT Pub. Date: Sep. 12, 2013

(65) Prior Publication Data
US 2014/0240209 A1    Aug. 28, 2014

(30) Foreign Application Priority Data

Mar. 5, 2012    (CN) .................... 2012 2 0079453 U

(51) Int. Cl.
*G11C 19/28*    (2006.01)
*G09G 3/36*    (2006.01)

(52) U.S. Cl.
CPC .......... *G11C 19/28* (2013.01); *G09G 3/3648* (2013.01); *G09G 3/3677* (2013.01); *G09G 2300/0408* (2013.01); *G09G 2310/0286* (2013.01)

(58) Field of Classification Search
CPC .............. G09G 3/3648; G09G 3/36; G09G 2310/0286; G09G 3/3677; G09G 2310/08;
(Continued)

(56) References Cited

U.S. PATENT DOCUMENTS

2007/0296662 A1* 12/2007 Lee ................. G09G 3/3677
345/87

FOREIGN PATENT DOCUMENTS

CN    202443728 U    9/2012

OTHER PUBLICATIONS

International Preliminary Report on Patentability Appln. No. PCT/CN2013/071643; Dated Sep. 9, 2014.
(Continued)

*Primary Examiner* — Michael Faragalla
*Assistant Examiner* — Sepideh Ghafari
(74) *Attorney, Agent, or Firm* — Ladas & Parry LLP

(57) ABSTRACT

Disclosed is a shift register, a gate driver and a display apparatus. The shift register comprises: a pulling-up transistor (M3), a pulling-down transistor (M10), an output transistor (M12) and a reset unit, and further comprises an output pulling-down unit for discharging the output terminal and connected to a pulling-down node (PD) of a present stage, a pulling-down node (PD) of an adjacent stage, a low voltage signal terminal (VSS) and an output terminal (OUTPUT) respectively, which turns on the connection between the output terminal and the low voltage signal terminal (VSS) when the pulling-down node (PD) of the present stage or the pulling-down node (PD) of the adjacent stage is at a high level; and a controlling transistor (M14) having a gate connected to the pulling-up node (PU), a drain connected to the pulling-down node (PD) of the adjacent stage, and a source connected to the low voltage signal terminal (VSS).

(Continued)

The shift register can effectively prevent the occurrence of the phenomenon of plural outputs by suppressing by the output pulling-down unit the noise in the output of each of the shift registers in the odd number of time unit and the even number of time unit after the operation of the shift register, thus increasing the stability of GOA unit and ensuring the display effect of the liquid crystal panel.

17 Claims, 3 Drawing Sheets

(58) Field of Classification Search
CPC .............. G09G 3/20; G09G 2310/0267; G06F 3/0412; G06F 3/0416
See application file for complete search history.

(56) References Cited

OTHER PUBLICATIONS

International Search Report mailed May 23, 2013; PCT/CN2013/071643.

* cited by examiner

SHIFT REGISTER, GATE DRIVER, AND DISPLAY APPARATUS

TECHNICAL FIELD OF THE DISCLOSURE

The present disclosure relates to the technical field of display device, and particularly to a shift register, a gate driver and a display apparatus.

BACKGROUND

In displays of the type of Thin Film Transistor-Liquid Crystal Display (TFT-LCD), each pixel unit has a corresponding TFT on an array substrate, a gate of the TFT is connected to a scanning line (also referred to as row scanning line) in a horizontal direction, a drain of the TFT is connected to a data line in a vertical direction, and a source of the TFT is connected to a pixel electrode. During displaying of a display, if a sufficient positive voltage is applied on the scanning line of a row in the horizontal direction, all of TFTs of the row are turned on under the control of the gates of TFTs, the pixel electrodes corresponding to the TFTs of the row at this moment will be connected to the data lines in the vertical direction respectively, and thus display signal voltages transmitted on the data lines will be written into the pixel electrodes respectively, so that, for one of the pixel electrodes, the liquid crystal in the pixel unit region corresponding to the pixel electrode is in turn controlled to achieve a different optical transmittance, thus achieving the control of the grayscale and/or color displayed by the pixel units.

At present, a driving circuit of the TFT-LCD panel is mainly implemented by attaching Integrated Circuit (IC) on the outer edge of the panel, and the IC is generally manufactured by using a silicon chip constructed by CMOS. Since the attached IC occupies a certain area and the connection lines for connecting IC also occupy a certain area, the panel thus obtained has a low integration level and a large area, which goes against the miniaturization and thinning of the display apparatus.

In order to solve such a problem, Gate Driver on Array (GOA) technology has been developed, which manufactures the Gate Driver IC of the TFT-LCD directly on the array substrate so as to replace the driving IC attached on the outer edge of the panel and manufactured by using the silicon chip. Since such technology can manufacture the driving circuit directly on the array substrate, the attaching of IC on the outer edge of the panel and the wiring are not required, thus reducing the manufacturing procedure of the panel and decreasing the cost of products while increasing the integration level of the TFT-LCD panel to make the panel thinner. There are many methods for implementing integrated gate driver registers in the prior art, a register may include different numbers of transistors and capacitors and the commonly used structures may include for example 12T1C (a structure including 12 Thin Film Transistors and 1 coupling capacitor), 9T1C, 13T1C and the like, and pulse shifting is achieved in the register by at least a group of clock signals, a pulling-up transistor, a pulling-down transistor and an output transistor.

Since the registers in GOA have a high integration level and are sensitive to noise, and since the duty ratio of the pulling down (PD) voltage generated by a CLK signal (clock signal) or a CLKB (inverse clock signal, that is, a signal inverse to the clock signal) signal is only 50% in the prior shift register, a pulling-down transistor only can discharge the output noise (i.e. the noise in the output) during half of a frame. If the output noise fails to be effectively suppressed in the shift register circuit at a certain stage and becomes the input to the shift register circuit at a next stage, the output noise will be amplified stage by stage. Specially, after the shift register circuit operates under a high temperature circumstance for a period of time, the noise will be more apparent and even may cause a plurality of outputs, causing turbulence in the display of TFT-LCD.

SUMMARY (1) Technical Problem to be Solved

Aiming at the above disadvantages, in order to solve the problem that the shift register may generate a plurality of outputs under a high temperature circumstance in the prior art, the present disclosure provides a shift register, a gate driver and a display apparatus.

(2) Technical Solutions

In order to solve the above problem, an embodiment of the present disclosure firstly provides a shift register comprising a pulling-up transistor having a drain connected to a first clock signal terminal, a gate connected to a pulling-up node, and a source connected to an output terminal; a first capacitor connected between the gate and the source of the pulling-up transistor; a pulling-down transistor having a drain connected to the pulling-up node, a gate connected to a pulling-down node of the present stage, and a source connected to a low voltage signal terminal; an output transistor having a gate connected to a second clock signal terminal, a drain connected to the output terminal, and a source connected to the low voltage signal terminal; a reset unit connected to a reset signal terminal, the pulling-up node, the output terminal and the low voltage signal terminal respectively; wherein the shift register further comprising: an output pulling-down unit for discharging the output terminal and connected to the pulling-down node of the present stage, a pulling-down node of an adjacent stage, the low voltage signal terminal and the output terminal respectively.

In an example, the shift register further comprises a controlling transistor having a gate connected to the pulling-up node, a drain connected to the pulling-down node of the adjacent stage, and a source connected to the low voltage signal terminal.

In an example, the shift register further comprises a pulling-up driving unit for controlling the level of the pulling-up node and connected to an input terminal, the second clock signal terminal and the pulling-up node respectively; and a pulling-down driving unit for controlling the level of the pulling-down node of the present stage and connected among the second clock signal terminal, the pulling-up node and the low voltage signal terminal.

In an example, the output pulling-down unit comprises a first output pulling-down transistor and a second output pulling-down transistor, wherein the first output pulling-down transistor has a gate connected to the pulling-down node of the present stage, a source connected to the low voltage signal terminal and a drain connected to the output terminal; and the second output pulling-down transistor has a gate connected to the pulling-down node of the adjacent stage, a source connected to the low voltage signal terminal and a drain connected to the output terminal.

In an example, the reset unit comprises a first reset transistor and a second reset transistor, wherein the first reset transistor has a drain connected to the pulling-up node, a source connected to the low voltage signal terminal and a gate connected to the reset signal terminal; and the second reset transistor has a drain connected to the output terminal, a source connected to the low voltage signal terminal and a gate connected to the reset signal terminal.

In an example, the pulling-up driving unit comprises a first pulling-up driving transistor and a second pulling-up driving transistor, wherein the first pulling-up driving transistor has a gate and a drain simultaneously connected to the input terminal and a source connected to the pulling-up node; and the second pulling-up driving transistor has a drain connected to the input terminal, a source connected to the pulling-up node and a gate connected to the second clock signal terminal;

the pulling-down driving unit comprises a first pulling-down driving transistor, a second pulling-down driving transistor, a third pulling-down driving transistor and a fourth pulling-down driving transistor, wherein the first pulling-down driving transistor has a drain connected to the second clock signal terminal and a source connected to the pulling-down node in the shift register; the second pulling-down driving transistor has a drain connected to the pulling-down node of the present stage, a source connected to the low voltage signal terminal and a gate connected to the pulling-up node; the third pulling-down driving transistor has a gate and a drain simultaneously connected to the second clock signal terminal, and a source connected to a gate of the first pulling-down driving transistor; and the fourth pulling-down driving transistor has a drain connected to the source of the third pulling-down driving transistor, a source connected to the low voltage signal terminal and a gate connected to the pulling-up node.

On the other hand, the present disclosure further provides a gate driver comprising a plurality of shift registers described above connected in cascade.

In an example, the cascade structure of the gate driver is: the first clock signal terminal and the second clock signal terminal of each stage of the plurality of shift registers are connected to two clock signals having phases opposite to each other; the low voltage signal terminal is connected to a low voltage signal; the input terminal of each stage of the plurality of shift registers is connected to the output terminal of a previous stage of shift register so that the output of the previous stage of shift register is used as the input of the present stage; meanwhile the output terminal of each stage is further connected to the reset signal terminal of a previous stage of shift register so that the output of the present stage is used as the reset signal of the previous stage of shift register; in addition, the pulling-down node in each stage of the plurality of shift registers is connected to the output pulling-down unit in a previous or a next stage of shift register.

In an example, in the above mentioned cascade structure, the first clock signal terminals of the register shifters at odd stages and the second clock signal terminals of the register shifters at even stages receive a first clock signal, the first clock signal terminals of the register shifters at even stages and the second clock signal terminals of the register shifters at odd stages receive a second clock signal having a phase inverse to that of the first clock signal, the input terminal of the register shift at a first stage receives an initial start signal, and a reset signal of the register shift at a last stage is supplied by a reset terminal formed by two transistors.

Finally, an embodiment of the present disclosure further provides a display apparatus comprising the above described gate driver.

Although the source and the drain of the Thin Film Transistor have symmetric structures, it is uniformly prescribed in the embodiments of the present disclosure that the drain of n-type transistor is at the upper portion of the symbol of TFT and the source thereof is at the lower portion of the symbol of TFT.

(3) Advantageous Effects

The present disclosure can effectively prevent the occurrence of the phenomenon of plural outputs by suppressing by the output pulling-down unit the noise in the output of each of the shift registers in the odd number of time unit and the even number of time unit after the operation of the shift register, thus increasing the stability of GOA unit and ensuring the display effect of the liquid crystal panel.

DETAILED DESCRIPTION

The technical solutions in embodiments of the present disclosure will be described clearly and completely below in connection with the accompanying drawings of the embodiments of the present disclosure. Obviously, the described embodiments are not all of embodiments of the present disclosure but only a part of embodiments of the present disclosure. With the teachings of the embodiments of the present disclosure, all of other embodiments obtained by those skilled in the art without paying creative labor should belong to the scope sought for protection in the present disclosure.

In the shift register of the present disclosure, an output pulling-down unit is added to suppress the noise in the output of each of the shift registers in the odd number of time unit and the even number of time unit after the operation of the shift register, so that the occurrence of plural outputs can be effectively prevented under a high temperature circumstance.

Particularly, in the shift register of the present disclosure, the output of the shift register is discharged by using the output pulling-down unit, and the output pulling-down unit is connected to the pulling-down node voltage PD of the present stage and the pulling-down node PD of an adjacent stage (that is, node PD in a previous stage of shift register or a next stage of shift register) voltage signal respectively, so as to realize the discharge of the odd and even number of time unit. In addition, a controlling transistor is set correspondingly in the present disclosure, a pulling-up (PU) voltage is inputted to a gate of the controlling transistor, when a node PU is at a high level, the PD voltage in the adjacent stage is discharged such that the control level for the corresponding output pulling-down unit is low.

Figure 1:
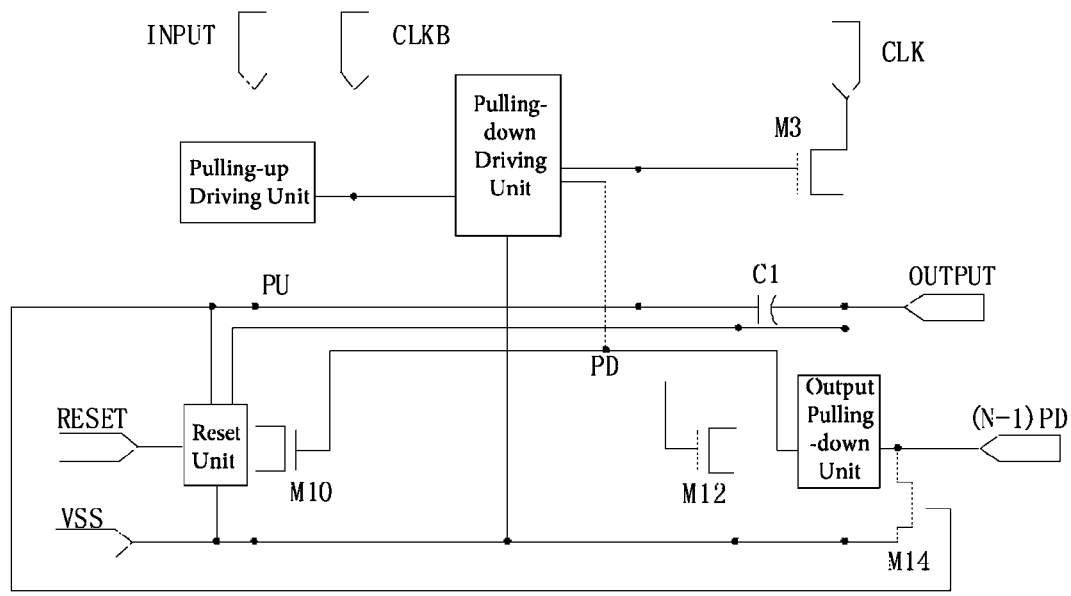
FIG. 1 is a structure diagram of a circuit of the shift register in the present disclosure.

Furthermore, as shown in FIG. 1, in an embodiment of the present disclosure, the shift register includes an input terminal INPUT, an output terminal OUTPUT, a reset signal terminal RESET, a first clock signal terminal CLK, a second clock signal terminal CLKB (wherein the second clock signal CLKB is a signal having a phase inverse to that of the first clock signal CLK), a low voltage signal terminal VSS and an adjacent stage pulling-down node terminal (a previous stage pulling-down node (N−1)PD is taken as an example in FIG. 1). In addition, inside the shift register, there are several special control voltage points: a pulling-up node PU and a pulling-down node PD of the present stage. With detailed circuit connection diagram shown in FIG. 1, the shift register includes: a pulling-up transistor M3 having a drain connected to the first clock signal terminal CLK, a gate connected to the pulling-up node PU, and a source connected to the output terminal OUTPUT; a first capacitor C1 connected between the gate and the source of the pulling-up transistor M3; a pulling-down transistor M10 having a drain connected to the pulling-up node PU, a gate connected to the pulling-down node PD of the present stage, and a source connected to the low voltage signal terminal VSS; an output transistor M12 having a gate connected to the second clock signal terminal CLKB, a drain connected to an output terminal OUTPUT, and a source connected to the low voltage signal terminal VSS; a reset unit connected to the reset signal terminal RESET, the pulling-up node PU, the output terminal OUTPUT and the low voltage signal terminal VSS respectively; and an output pulling-down unit for discharging the output terminal and connected to the pulling-down node PD of the present stage, a pulling-down node (N−1)PD of the adjacent stage, the low voltage signal terminal VSS and the output terminal OUTPUT respectively.

In addition, the shift register can further include a controlling transistor M14 having a gate connected to the pulling-up node PU, a drain connected to the pulling-down node PD of the adjacent stage, and a source connected to the low voltage signal terminal VSS. The controlling transistor M14 can discharge the pulling-down node (N−1)PD of the adjacent stage when the pulling-up node PU is at a high level, such that the control level of the corresponding output pulling-down unit is low, and thus the pulling-down effect on the output of the shift register by the output pulling-down unit can be effectively controlled.

It should be explained that the previous stage pulling-down node (N−1)PD is merely taken as an example of the adjacent pulling-down node in FIG. 1, since the gate driver performs driving row by row in practice and the case for driving a previous stage shift register adjacent to a present stage shift register is the same as that for driving a next stage shift register adjacent to the present stage shift register, so that the previous pulling-down node (N−1)PD in FIG. 1 can be replaced with a next stage pulling-down node (N+1)PD, and the operational principle is the same as that of FIG. 1 with the detailed description omitted.

Figure 2:
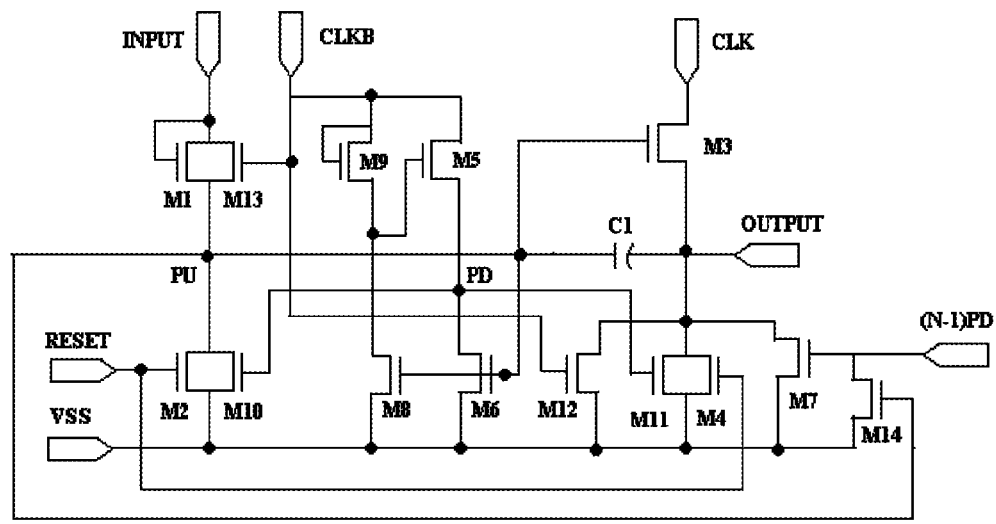
FIG. 2 is a structure diagram of a circuit of the shift register in one embodiment of the present disclosure.

In an example, respective transistors and respective element unit in the shift register of the present disclosure can be constituted by TFTs, and signal connections among respective key elements of the present disclosure will be further described with the aid of the embodiment shown in FIG. 2.

In FIG. 2, TFT M11 and TFT M7 are two output pulling-down transistors and constitute a output pulling-down unit together. The first output pulling-down transistor TFT M11 is controlled by the second clock signal, when CLKB becomes a high level, the node PD is at a high level, TFT M11 is turned on to pull OUTPUT down and discharge the noise in the output. The second output pulling-down transistor TFT M7 is controlled by the previous stage pulling-down node (n−1)PD, when the previous stage node (n−1)PD is at a high level, TFT M7 is turned on to discharge the noise in the output, such that the occurrence of the phenomenon of plural outputs is avoided. TFT M11 has a gate connected to the node PD, a source connected to VSS and a drain connected to OUTPUT; and TFT M7 has a gate connected to the node (N−1)PD, a source connected to VSS and a drain connected to OUTPUT.

TFT M14 is a controlling transistor for the output pulling-down transistor TFT M7 and is turned on when the node PU is at a high level, such that the previous stage pulling-down node (N−1)PD is discharged to make sure that the input voltage to the gate of TFT M7 is at a low level, and thus the Gate signal is outputted normally without being affected. TFT M14 has a gate connected to the pulling-up node PU, a drain connected to (N−1)PD and a source connected to VSS.

Other transistors and the capacitor C1 have the same operational principle as that of the existing 12T1C structure with the following brief descriptions. TFT M3 is a pulling-up transistor, the signal input to the first clock signal terminal CLK is outputted to the output terminal OUTPUT when TFT M3 is turned on by the pulling-up node PU. TFT M2 and TFT M4 are two reset transistors and form a reset unit together, the first reset transistor TFT M2 and the second reset transistor TFT M4 are turned on to reset the pulling-up node PU and the output terminal OUTPUT (that is, to pull down the signals at the pulling-up node PU and the output terminal OUTPUT to a turned-off voltage) when the reset signal input to the reset signal input terminal RESET (that is, the output signal of the next stage shift register) is active. TFT M1 and TFT M13 are two pulling-up driving transistors and form a pulling-up driving unit together, the capacitor C1 is also used for pulling-up driving, a signal is input to the signal input terminal INPUT and the second clock signal CLKB have the same phase, when both the input signal and the second clock signal CLKB are active, the first pulling-up driving transistor TFT M1 and the second pulling-up driving transistor TFT M13 are turned on to charge one plate of C1, such that the pulling-up node PU is at a high level and the second pulling-up driving transistor TFT M3 is in a turned-on state. When the clock signal input from CLK becomes a high level at a next timing, the level of the pulling-up node PU (that is the gate of TFT M3) gets higher due to the bootstrapping effect of the capacitor C1, such that an effect of threshold voltage compensation is achieved. The pulling-down transistor TFT M10 is controlled by the pulling-down node PD and is turned on when the node PD is at a high level, such that the pulling-up node PU is pulled down, and thus the coupling noise generated when CLK changing from a low level to a high level can be discharged. TFT M5, TFT M6, TFT M8 and TFT M9 are four pulling-down driving transistors and form a pulling-down driving unit together which mainly controls the output of the level of the node PD and drives the pulling-down transistor to operate. TFT M12 is an output transistor and provides the output signal of the shift register under the control of the second clock signal input to the second clock signal terminal CLKB.

Figure 3:
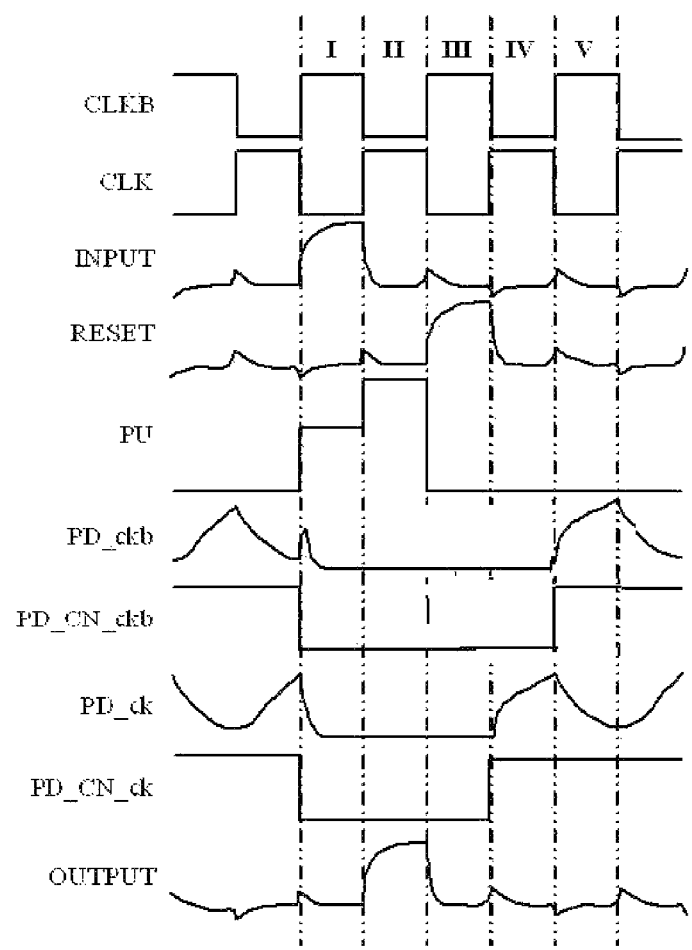
FIG. 3 is a timing sequence diagram of the logic level of signals in the shift register in the present disclosure.

The operation procedure of the shift register of the present disclosure shown in FIG. 2 will be further described below with reference to the schematic diagram of level of signals shown in FIG. 3. It should be explained that, in FIG. 3, the pulling-down voltage PD generated by the signal of CLKB is defined as PD_ckb, the pulling-down voltage (N−1)PD in the previous stage shift register generated by the signal of CLK is defined as PD_ck. A node PD_CN is connected to the gate of transistor M5. A voltage at PD_CN generated by the signal of CLKB is defined as PD_CN_ckb, and a voltage at (N−1)PD_CN in the previous stage shift register generated by the signal of CLK is defined as PD_CN_ck.

In a first period I, since INPUT is at a high level and RESET is at a low level, the node PU is at a high level and the transistors M1, M3, M6, M8, M12 and M14 are turned on; since CLK is at a low level, PD_ck is at a low level and CLKB is at a high level, the transistor M5 is turned on, and the node PD_ckb can be controlled to approach a low level by setting the proportion between the channel width-length ratio of M5 and the channel width-length ratio of M6; since RESET is at a low level, the transistors M2 and M4 are turned off; since the transistors M4, M10 and M11 are turned off and M3 is turned on, the output is equal to CLK and is at a low level due to CLK being at a low level.

In a second period II, since INPUT becomes a low level and RESET is still a low level, the node PU is still at a high level, the transistors M3, M6, M8 and M14 are still turned on, and thus PD_ck is at a low level; since CLKB becomes a low level, the transistor M5 is turned off, and the node PD_ckb is still at a low level; since RESET is still at a low level, the transistors M2 and M4 are turned off; since CLK becomes a high level and the transistor M3 is turned on, the output is equal to CLK and is at a high level due to CLK being at a high level.

In a third period III, since INPUT is still at a low level, the transistor M1 is turned off; since RESET becomes a high level, the transistors M2 and M4 are turned on; the node PU is discharged to a low level, the transistors M3, M6, M8 and M14 are turned off; since CLKB is at a high level, the transistor M5 is turned on; since CLK is at a low level and PD_ck is at a low level, M7 is turned off; since M3 is turned off and M4 is turned on, the output is equal to the low level VSS and is at a low level.

In a fourth period IV, INPUT is still at a low level, the transistor M1 is turned off; since RESET becomes a low level, the transistors M2 and M4 are turned off; since the node PU is still at a low level, the transistors M3, M6, M8 and M14 are still turned off; since CLKB is at a low level, the transistor M5 is turned off, the node PD_ckb is at a low level, and thus the transistors M10 and M11 are turned off; since CLK becomes a high level, the node PD_ck becomes a high level, M7 is turned on, and since the transistors M3 and M4 are turned off, the output keeps at a low level.

In a fifth period V, INPUT is still at a low level, the transistor M1 is turned off; since RESET is still at a low level, the transistors M2 and M4 are turned off; since the node PU is at a low level, the transistors M3, M6, M8 and M14 are still turned off; since CLKB is at a high level, the transistor M9 is turned on, the level of the node PD_ckb increases gradually from the lowest point, and thus the transistor M5 becomes to be fully turned on gradually from being turned off (at this moment, if there is noise at the node PU, the noise can be discharged by M10; if there is noise at the output, the noise can be discharged by M11); since CLK is at a low level, PD_ck is at a low level, and thus M7 is turned off; since the transistors M3 and M4 are turned off, the output keeps at a low level.

Figure 4:
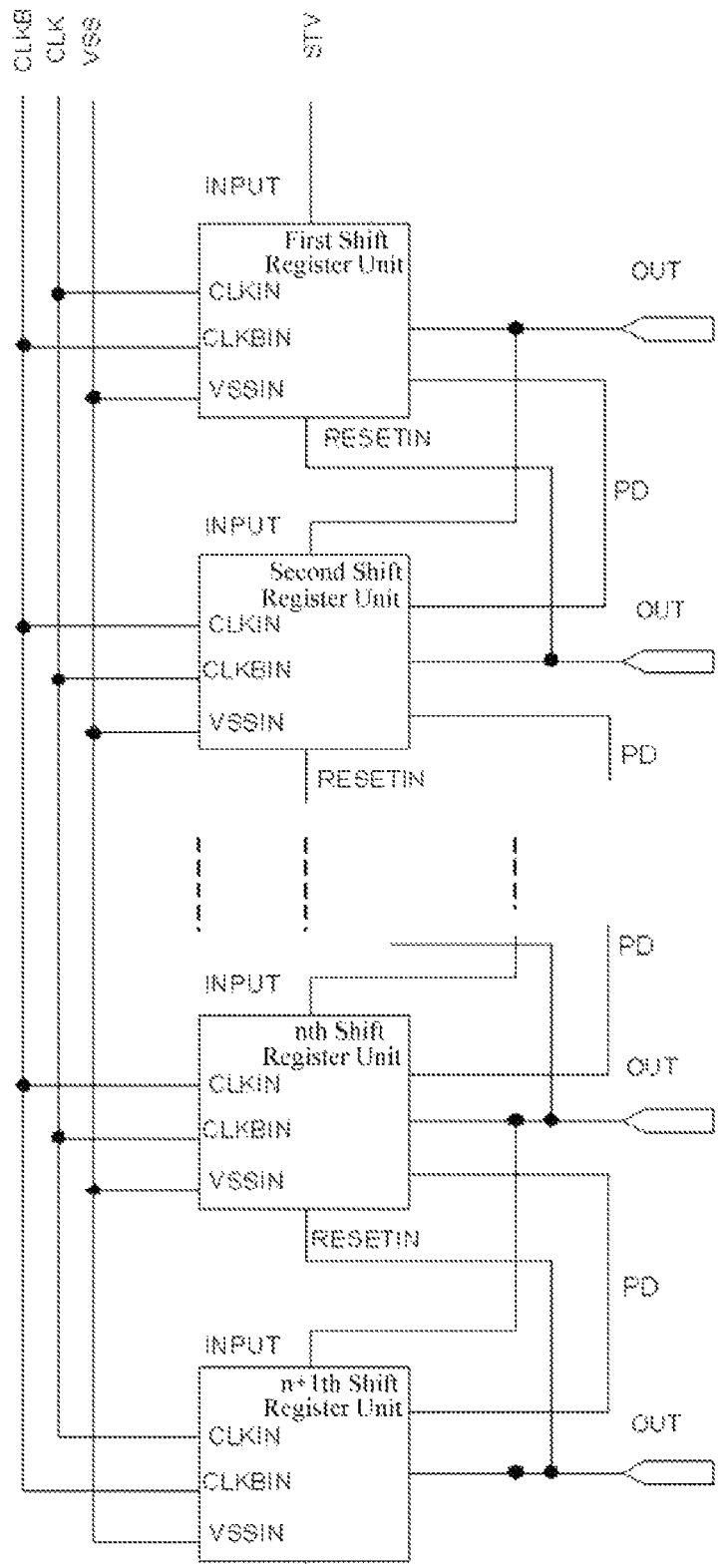
FIG. 4 is a structure diagram of a circuit of the gate driver including a plurality of shift registers connected in cascade in the present disclosure.

In the present disclosure, a gate driver of a liquid crystal panel is constituted by a plurality of shift registers described above connected in cascade. Particularly, a cascade structure of the gate driver constituted by (n+1) shift registers connected in cascade is shown in FIG. 4. As shown in FIG. 4, the first clock signal terminal CLKIN and the second clock signal terminal CLKBIN of each stage of the shift registers are connected to two clock signals having phases opposite to each other (that is, the first clock signal CLK and the second clock signal CLKB); the low voltage signal terminal VSSIN is connected to a low voltage signal VSS; the input terminal INPUT of each stage of the shift registers is connected to the output terminal OUT of a previous stage so that the output of the previous stage is used as the input of the present stage; meanwhile the output terminal OUT of each stage is further connected to the reset signal terminal RESETIN of a previous stage so that the output of the present stage is used as the reset signal of the previous stage; in addition, the pulling-down node PD in each stage is connected to a next stage to provide a control signal for the second output pulling-down transistor in the next stage (since the node PD can be connected to an adjacent stage as described above, the node PD can be connected to the output pulling-down unit in a previous stage). Specifically, the first clock signal terminals CLKIN of the register shifters at odd stages (corresponding to the first clock signal terminal CLK connected to the drain of M3 in FIGS. 1-2, and terminal correspondence for the following is similar to the above) and the second clock signal terminals CLKBIN of the register shifters at even stages are connected to a first clock signal CLK, the first clock signal terminals CLKIN of the register shifters at even stages and the second clock signal terminals CLKBIN of the register shifters at odd stages are connected to a second clock signal CLKB having a phase inverse to that of the first clock signal, that is, the clock control for the register shifts at the odd stages such as the first stage, the third stage, the fifth stage and so on is opposite to that for the register shifts at the even stages such as the second stage, the fourth stage, the sixth stage and so on. The input terminal of the register shift at a first stage is connected to an initial start signal STV, and a reset signal of the register shift at a last stage is supplied by a reset terminal formed by two transistors (not shown in FIG. 4). With the gate driver having such cascade structure, the liquid crystal panel sequentially turns on the scanning lines one by one and turns off the remaining scanning lines under the driving of the respective input signals, such that only TFTs corresponding to the pixel units in the row of the turned-on scanning line are driven, thus achieving progressive scanning.

In an example, the gate driver is integrated on the array substrate to form a GOA unit. The present disclosure also provides a display apparatus including the above described gate driver. The display apparatus may be any product or means possessing display function, such as a liquid crystal panel, an electronic paper, an OLED panel, a liquid crystal display television, a liquid crystal display, a digital photo frame, a mobile phone, a tablet computer, and the like.

In each of the shift registers of the present disclosure, when the CLK signal becomes a low level from a high level, the node PD in the previous stage is at a high level such that the noise on the output can be discharged; meanwhile the coupling noise generated when CLK becomes a high level from a low level is discharged due to a high level at the node PD in the present stage; so that the coupling noise on the output caused by an undesired voltage fluctuation can be effectively suppressed. At the same time, one controlling transistor M14 is set in the present disclosure, such that, when the node PU of the present stage is at a high level, the voltage input to the node PD of the previous stage is at a low level, and thereby the Gate signal will be outputted normally without being affected. With the embodiments of the present disclosure, the affect of the output noise on the next stage will be effectively suppressed while the normal output of the gate driving signal is not affected, such that the occurrence of the phenomenon of multiple outputs will be avoided in the high temperature circumstance, ensuring the performance of the liquid crystal display.

All of the transistors adopted in the above embodiments of the present disclosure are n-type transistors.

The above descriptions are only for illustrating the embodiments of the present disclosure, and in no way limit the scope of the present disclosure. It will be obvious that those skilled in the art may make modifications, variations and equivalences to the above embodiments without departing from the spirit and scope of the present disclosure as defined by the following claims. Such variations and modifications are intended to be included within the spirit and scope of the present disclosure. The patent protection scope of the present disclosure should be defined by the claims.

What is claimed is:

1. A shift register comprising:
    a pulling-up transistor having a drain connected to a first clock signal terminal, a gate connected to a pulling-up node, and a source connected to an output terminal;
    a first capacitor connected between the gate and the source of the pulling-up transistor;
    a pulling-down transistor having a drain connected to the pulling-up node, a gate connected to a pulling-down node of a present stage, and a source connected to a low voltage signal terminal;
    an output transistor having a gate connected to a second clock signal terminal, a drain connected to the output terminal, and a source connected to the low voltage signal terminal;
    a reset unit connected to a reset signal terminal, the pulling-up node, the output terminal and the low voltage signal terminal respectively;
    wherein the shift register further comprising:
    an output pulling-down unit for discharging the output terminal and connected to the pulling-down node of the present stage, a pulling-down node of the adjacent stage, the low voltage signal terminal and the output terminal respectively.

2. The shift register of claim 1, wherein the shift register further comprises:
    a controlling transistor having a gate connected to the pulling-up node, a drain connected to the pulling-down node of the adjacent stage, and a source connected to the low voltage signal terminal.

3. The shift register of claim 1, wherein the shift register further comprises:
    a pulling-up driving unit for controlling the level of the pulling-up node and connected to an input terminal, the second clock signal terminal and the pulling-up node respectively; and
    a pulling-down driving unit for controlling the level of the pulling-down node of the present stage and connected among the second clock signal terminal, the pulling-up node and the low voltage signal terminal.

4. The shift register of claim 1, wherein the output pulling-down unit comprises a first output pulling-down transistor and a second output pulling-down transistor, wherein
    the first output pulling-down transistor has a gate connected to the pulling-down node of the present stage, a source connected to the low voltage signal terminal and a drain connected to the output terminal; and
    the second output pulling-down transistor has a gate connected to the pulling-down node of the adjacent stage, a source connected to the low voltage signal terminal and a drain connected to the output terminal.

5. The shift register of claim 1, wherein the reset unit comprises a first reset transistor and a second reset transistor, wherein
    the first reset transistor has a drain connected to the pulling-up node, a source connected to the low voltage signal terminal and a gate connected to the reset signal terminal; and
    the second reset transistor has a drain connected to the output terminal, a source connected to the low voltage signal terminal and a gate connected to the reset signal terminal.

6. The shift register of claim 3, wherein the pulling-up driving unit comprises a first pulling-up driving transistor and a second pulling-up driving transistor, wherein
    the first pulling-up driving transistor has a gate and a drain simultaneously connected to the input terminal and a source connected to the pulling-up node; and
    the second pulling-up driving transistor has a drain connected to the input terminal, a source connected to the pulling-up node and a gate connected to the second clock signal terminal;
    the pulling-down driving unit comprises a first pulling-down driving transistor, a second pulling-down driving transistor, a third pulling-down driving transistor and a fourth pulling-down driving transistor, wherein
    the first pulling-down driving transistor has a drain connected to the second clock signal terminal and a source connected to the pulling-down node of the present stage;
    the second pulling-down driving transistor has a drain connected to the pulling-down node of the present stage, a source connected to the low voltage signal terminal and a gate connected to the pulling-up node;
    the third pulling-down driving transistor has a gate and a drain simultaneously connected to the second clock signal terminal, and a source connected to a gate of the first pulling-down driving transistor; and
    the fourth pulling-down driving transistor has a drain connected to the source of the third pulling-down driving transistor, a source connected to the low voltage signal terminal and a gate connected to the pulling-up node.

7. A gate driver comprising a plurality of shift registers connected in cascade, the shift register comprises:
    a pulling-up transistor having a drain connected to a first clock signal terminal, a gate connected to a pulling-up node, and a source connected to an output terminal;
    a first capacitor connected between the gate and the source of the pulling-up transistor;
    a pulling-down transistor having a drain connected to the pulling-up node, a gate connected to a pulling-down node of a present stage, and a source connected to a low voltage signal terminal;
    an output transistor having a gate connected to a second clock signal terminal, a drain connected to the output terminal, and a source connected to the low voltage signal terminal;
    a reset unit connected to a reset signal terminal, the pulling-up node, the output terminal and the low voltage signal terminal respectively;
    wherein the shift register further comprising:
    an output pulling-down unit for discharging the output terminal and connected to the pulling-down node of the present stage, a pulling-down node of the adjacent stage, the low voltage signal terminal and the output terminal respectively.

8. The gate driver of claim 7, wherein the shift register further comprises:
    a controlling transistor having a gate connected to the pulling-up node, a drain connected to the pulling-down node of the adjacent stage, and a source connected to the low voltage signal terminal.

9. The gate driver of claim 7, wherein the shift register further comprises:
   a pulling-up driving unit for controlling the level of the pulling-up node and connected to an input terminal, the second clock signal terminal and the pulling-up node respectively; and
   a pulling-down driving unit for controlling the level of the pulling-down node of the present stage and connected among the second clock signal terminal, the pulling-up node and the low voltage signal terminal.

10. The gate driver of claim 7, wherein the output pulling-down unit comprises a first output pulling-down transistor and a second output pulling-down transistor, wherein
   the first output pulling-down transistor has a gate connected to the pulling-down node of the present stage, a source connected to the low voltage signal terminal and a drain connected to the output terminal; and
   the second output pulling-down transistor has a gate connected to the pulling-down node of the adjacent stage, a source connected to the low voltage signal terminal and a drain connected to the output terminal.

11. The gate driver of claim 7, wherein the reset unit comprises a first reset transistor and a second reset transistor, wherein
   the first reset transistor has a drain connected to the pulling-up node, a source connected to the low voltage signal terminal and a gate connected to the reset signal terminal; and
   the second reset transistor has a drain connected to the output terminal, a source connected to the low voltage signal terminal and a gate connected to the reset signal terminal.

12. The gate driver of claim 9, wherein the pulling-up driving unit comprises a first pulling-up driving transistor and a second pulling-up driving transistor, wherein
   the first pulling-up driving transistor has a gate and a drain simultaneously connected to the input terminal and a source connected to the pulling-up node; and
   the second pulling-up driving transistor has a drain connected to the input terminal, a source connected to the pulling-up node and a gate connected to the second clock signal terminal;
   the pulling-down driving unit comprises a first pulling-down driving transistor, a second pulling-down driving transistor, a third pulling-down driving transistor and a fourth pulling-down driving transistor, wherein
   the first pulling-down driving transistor has a drain connected to the second clock signal terminal and a source connected to the pulling-down node of the present stage;
   the second pulling-down driving transistor has a drain connected to the pulling-down node of the present stage, a source connected to the low voltage signal terminal and a gate connected to the pulling-up node;
   the third pulling-down driving transistor has a gate and a drain simultaneously connected to the second clock signal terminal, and a source connected to a gate of the first pulling-down driving transistor; and
   the fourth pulling-down driving transistor has a drain connected to the source of the third pulling-down driving transistor, a source connected to the low voltage signal terminal and a gate connected to the pulling-up node.

13. The gate driver of claim 7, wherein the cascade structure of the gate driver is:
   the first clock signal terminal and the second clock signal terminal of each stage of the plurality of shift registers are connected to two clock signals having phases opposite to each other; the low voltage signal terminal receives a low voltage signal;
   the input terminal of each stage of the plurality of shift registers is connected to the output terminal of a previous stage shift register so that the output of the previous stage shift register is used as the input of the present stage;
   meanwhile the output terminal of each stage is further connected to the reset signal terminal of a previous stage shift register so that the output of the current stage is used as the reset signal of the previous stage shift register;
   in addition, the pulling-down node of each stage is connected to the output pulling-down unit in a previous or a next stage shift register.

14. The gate driver of claim 13, wherein in the cascade structure,
   the first clock signal terminals of the register shifters at odd stages and the second clock signal terminals of the register shifters at even stages are connected to a first clock signal, the first clock signal terminals of the register shifters at even stages and the second clock signal terminals of the register shifters at odd stages are connected to a second clock signal having a phase opposite to that of the first clock signal,
      the input terminal of a first stage receives an initial start signal, and a reset signal of a last stage is supplied by a reset terminal formed by two transistors.

15. A display apparatus including a gate driver comprising a plurality of shift registers connected in cascade, the shift register comprises:
   a pulling-up transistor having a drain connected to a first clock signal terminal, a gate connected to a pulling-up node, and a source connected to an output terminal;
   a first capacitor connected between the gate and the source of the pulling-up transistor;
   a pulling-down transistor having a drain connected to the pulling-up node, a gate connected to a pulling-down node of a present stage, and a source connected to a low voltage signal terminal;
   an output transistor having a gate connected to a second clock signal terminal, a drain connected to the output terminal, and a source connected to the low voltage signal terminal;
   a reset unit connected to a reset signal terminal, the pulling-up node, the output terminal and the low voltage signal terminal respectively;
   wherein the shift register further comprising:
   an output pulling-down unit for discharging the output terminal and connected to the pulling-down node of the present stage, a pulling-down node of the adjacent stage, the low voltage signal terminal and the output terminal respectively.

16. The display apparatus of claim 15, wherein the cascade structure of the gate driver is:
   the first clock signal terminal and the second clock signal terminal of each stage of the plurality of shift registers are connected to two clock signals having phases opposite to each other; the low voltage signal terminal receives a low voltage signal;
   the input terminal of each stage of the plurality of shift registers is connected to the output terminal of a previous stage shift register so that the output of the previous stage shift register is used as the input of the present stage;

meanwhile the output terminal of each stage is further connected to the reset signal terminal of a previous stage shift register so that the output of the current stage is used as the reset signal of the previous stage shift register;

in addition, the pulling-down node of each stage is connected to the output pulling-down unit in a previous or a next stage shift register.

17. The display apparatus of claim 16, wherein in the cascade structure, the first clock signal terminals of the register shifters at odd stages and the second clock signal terminals of the register shifters at even stages are connected to a first clock signal, the first clock signal terminals of the register shifters at even stages and the second clock signal terminals of the register shifters at odd stages are connected to a second clock signal having a phase opposite to that of the first clock signal, the input terminal of a first stage receives an initial start signal, and a reset signal of a last stage is supplied by a reset terminal formed by two transistors.

* * * * *